United States Patent [19]
Tsubaki et al.

[11] Patent Number: 5,647,944
[45] Date of Patent: Jul. 15, 1997

[54] MICROWAVE PLASMA TREATMENT APPARATUS

[75] Inventors: Takeshi Tsubaki, Kuga-gun; Katsuya Watanabe, Kudamatsu; Hidenori Takesue, Kudamatsu; Yoshiaki Sato, Kudamatsu; Katsuyoshi Kudo, Kudamatsu; Makoto Nawata, Kudamatsu, all of Japan

[73] Assignee: Hitachi, Ltd., Tokyo, Japan

[21] Appl. No.: 214,106

[22] Filed: Mar. 17, 1994

[30] Foreign Application Priority Data

Mar. 17, 1993 [JP] Japan .................................. 5-056809
Nov. 8, 1993 [JP] Japan .................................. 5-278085

[51] Int. Cl.$^6$ .................................................. H85H 1/00
[52] U.S. Cl. ........................... 156/345; 118/723 ME
[58] Field of Search ................. 156/345; 118/723 MW, 118/723 ME; 204/298.38

[56] References Cited

U.S. PATENT DOCUMENTS 5,134,965 8/1992 Tokuda et al. ................ 118/723 MW

FOREIGN PATENT DOCUMENTS 122123 5/1988 Japan .

Primary Examiner—Thi Dang
Attorney, Agent, or Firm—Antonelli, Terry, Stout & Kraus, LLP

[57] ABSTRACT

The present invention improves ashing speed for a treated object and ashing speed uniformity over the treated object by improving microwave transmission efficiency and by generating uniform and strong plasma in a plasma generating chamber. According to the present invention, the microwave treatment apparatus comprises expanding wave guide tubes having an expanded room of a given size on the microwave inlet side of a microwave inlet window 9 which forms a plasma generating chamber, and a partition board with a hole having an aspect ratio other than one in the room. Therewith, a microwave resonant space is formed with interposing the partition board inside the space of the expanded wave guide tube to generate a uniform and strong electric field inside the space of the expanded wave guide tube, and then the microwave is injected into the plasma generating chamber through the microwave inlet window to generate uniform and strong plasma in the plasma generating chamber.

10 Claims, 4 Drawing Sheets

MICROWAVE PLASMA TREATMENT APPARATUS

BACKGROUND OF THE INVENTION

1. Field of the Invention

The present invention relates to a microwave plasma treatment apparatus, more particularly, to a microwave plasma treatment apparatus suitable for ashing treatment of semiconductor substrate.

2. Description of the Prior Art

The prior art on microwave plasma treatment apparatus is disclosed, for example, in Japanese Patent Application Laid-Open No. 63-122123 (1988). The apparatus comprises a reflecting terminal having a plurality of small holes attached to a bottom side opening of a circular wave guide tube which forms a plasma generating chamber and is connected to a treatment chamber having a sample table, and a discharge tube having a concave surface being in parallel relationship with the sample table attached to an upper side opening of the circular wave guide tube which is connected to a wave guide tube for microwave. In order to generate high efficient plasma, the distance between the reflecting terminal and the discharge tube is made to be larger than one-eighth of the guide wave length of microwave. And in order to perform homogeneous ashing treatment throughout a wafer, the reflecting terminal is placed in parallel relationship with the wafer. Thus, the wafer is treated uniformly in a short time.

In the prior art described above, however, the control of microwave inside the wave guide tube is not taken into consideration, the microwave guiding efficiency into the plasma generating chamber is not sufficiently high, and the ashing treatment speed and the ashing treatment speed uniformity over the surface are not sufficient.

SUMMARY OF THE INVENTION

An object of the present invention is to provide a microwave plasma treatment apparatus having high ashing treatment speed by means of controlling microwave inside a wave guide tube to improve the plasma generating efficiency.

Another object of the present invention is to provide a microwave plasma treatment apparatus having a high ashing treatment speed as well as an excellent ashing treatment speed uniformity by means of controlling microwave inside a wave guide tube to improve the plasma generating efficiency.

The object described above can be attained by providing a plasma generating chamber to which treatment gas is supplied and pressure of which is kept at a given pressure, a plasma treatment chamber connected to said plasma generating chamber, a wave guide tube one end of which is connected to said plasma generating chamber in the opposite side of the plasma treatment chamber and the other end of which is provided with a microwave generating source, an expanded room having a certain space size at the portion of the plasma generating chamber connected with said wave guide tube, and a partition board inside said expanded room.

The other object described above can be attained by providing a plasma generating chamber, means for supplying treatment gas into the plasma generating chamber, a treatment chamber connected to one end of the plasma generating chamber through a punching metal, means for evacuating the treatment chamber, an expanded wave guide tube connected to the other end of the plasma generating chamber through a microwave inlet window and having an expanded room having a certain space size at the connecting portion of the plasma generating chamber, and a ring-shaped partition board having an aspect ratio other than one on the inside surface of expanded portion of the expanded wave guide tube.

According to the present invention, the microwave generated by the microwave generating source is guided to the inside of the wave guide tube having the room containing the partition board. In the expanded room of the wave guide tube, a resonant space of microwave is formed with interposing the partition board to generate a strong electric field inside the room of the wave guide tube, then the microwave having strong electric field is injected into the microwave inlet window. Therewith, a strong plasma is generated inside the plasma generating chamber, and ashing speed for treated object is increased.

By means of providing the inside of the wave guide tube with the partition board, the strong electric field is produced and the activated particles are efficiently generated in the plasma generating chamber, which has effect of improving the ashing treatment speed.

Further, by means of making the shape of the partition board have an aspect ratio other than one and optimized, uniform electric field is formed inside the space of the expanded wave guide tube and uniform plasma is generated inside the plasma generating chamber. Therewith, the ashing speed for treated object is increased and the ashing treatment speed uniformity over the surface is improved.

DETAILED DESCRIPTION OF THE PREFERRED EMBODIMENT

One embodiment according to the present invention will be described referring to FIG. 1 through FIG. 5.

Figure 1:
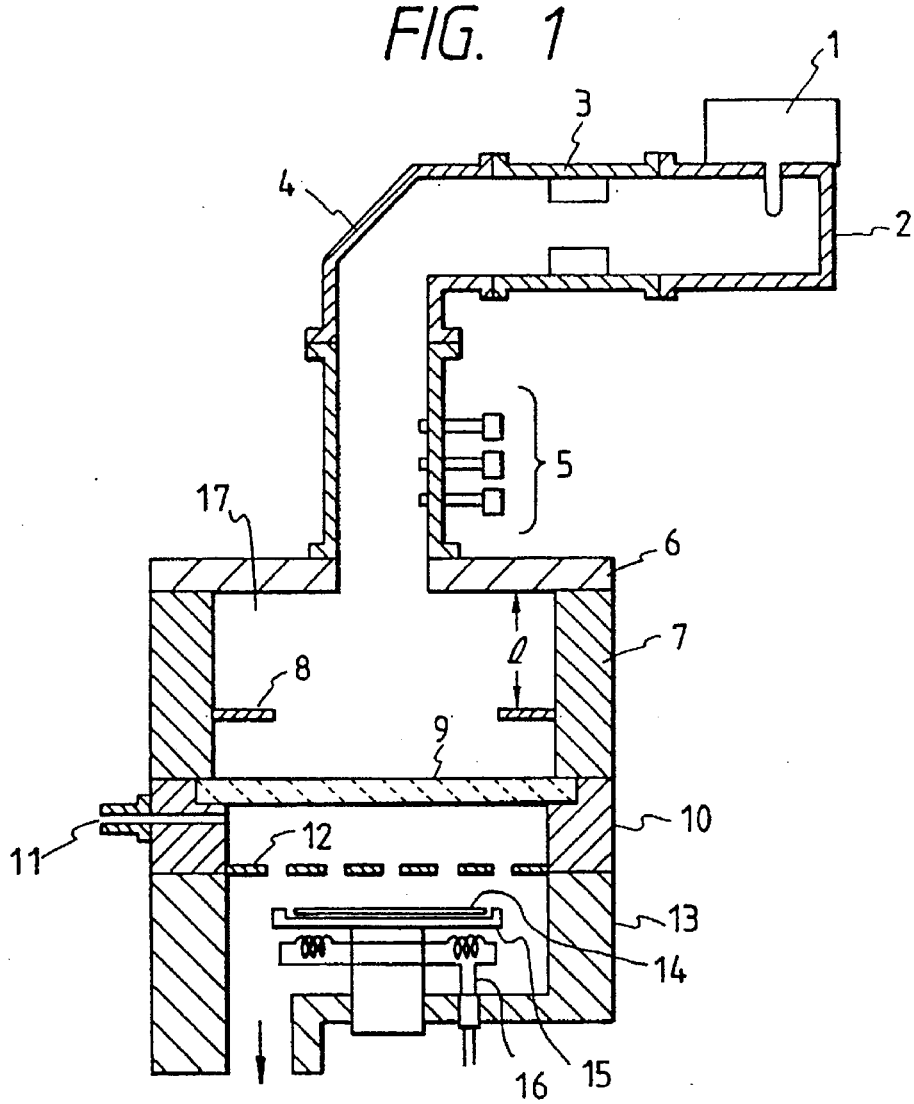
FIG. 1 is a vertical cross-sectional view showing the construction of an embodiment of a microwave plasma treatment apparatus according to the present invention.

FIG. 1 shows a microwave plasma treatment apparatus according to the present invention. A plasma generating chamber is formed by being surrounded with a discharge block 10, a punching metal 12 and a microwave inlet window 9. The microwave inlet window 9 is made with a silica plate which is transmissible of microwave and capable of forming a plasma generating chamber. Alumina can be also used for it instead of silica. The punching metal 12 is made of aluminum and has a plurality of small holes. The distance between the punching metal 12 and the microwave inlet window 9 is larger than one-eighth of the wave length of microwave in the guide tube as described in Japanese Patent Application Laid-Open No. 62-122123 (1987). The diameter of the holes on punching metal 12 is 3 to 15 mm. The discharge block 10 has a treatment gas supply opening 11 which is connected to a treatment gas supply unit (not shown).

In a plasma treatment chamber 13 communicating with the plasma generating chamber through the punching metal 12, a sample table 15 to place a wafer 14, that is treated object, is provided in parallel relationship with the microwave inlet window 9. A heater 16 is provided under the sample table 15 to heat the wafer indirectly. A pumping unit (not shown) is connected to the bottom of the plasma treatment chamber 13 to evacuate the plasma treatment chamber 13 and the plasma generating chamber and to keep them at a given pressure.

An expanded wave guide tube is connected to the plasma generating tube through the microwave inlet window 9. The expanded wave guide tube, in this case, comprises a wave guide tube 2, isolator 3, a right angle transducer 4, a matching unit 5 and wave guide tubes 6 and 7. A magnetron 1, which is a microwave generating source, is of frequency of 2.45 GHz in this case. And the rectangular-shaped wave guide tube 2, to which the magnetron 1 is attached, is of standard size capable of transmitting microwave of TE10 mode in this case. The numeral 3 indicates an isolator to absorb the reflected wave returning inside the rectangular wave guide tube 2. The right angle transducer 4 is to change the travelling direction of microwave by right angle. The numeral 5 indicates a matching stub which performs impedance matching of load in order to eliminate the reflection of the microwave transmitted in the rectangular wave guide tube 2.

Figure 2:
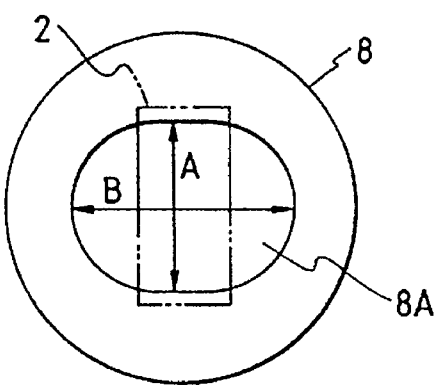
FIG. 2 is a plan view showing a partition board in the microwave plasma treatment apparatus shown in FIG. 1.
Figure 3:
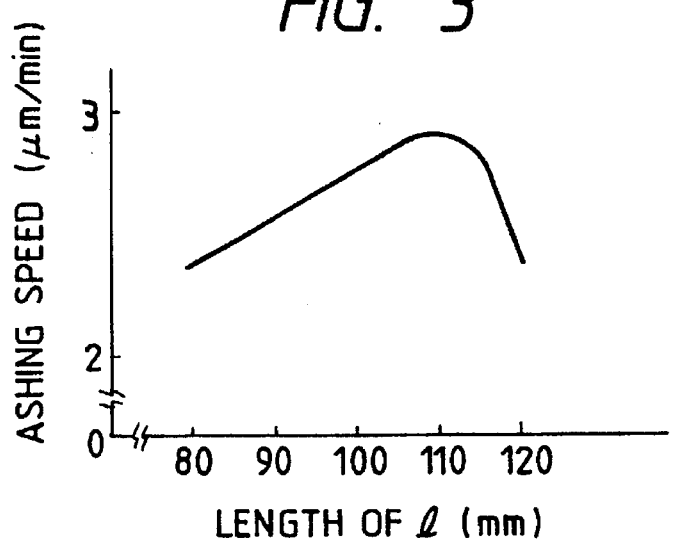
FIG. 3 is a graph showing a relationship between position of the partition board and ashing speed for the microwave plasma treatment apparatus shown in FIG. 1.

A resonant room 17, which is an expanded room in the expanded wave guide tube, is formed by the wave guide tubes 6 and 7 and the microwave inlet window 9, and a partition board 8 made of aluminum is provided in the resonant room to make the microwave resonated. The partition board 8 is formed in such a ring-shape that the shape of its hole has 8A its longitudinal length A different from its lateral length B as shown in FIG. 2. The partition board 8 is arranged in such a way that the direction of the longer axis of hole 8A is perpendicular to the longer side of the rectangle of the wave guide tube.

Explanation will be made below on a case where the apparatus constructed as described above is used as an ashing apparatus. Using a microwave transmission technology known in the art, a wafer 14 to be performed ashing for photoresist is mounted on the sample table 15 kept at the temperature of 200° C. by the heater 16, $O^2$ gas of 1400 sccm being supplied from the treatment gas inlet opening 11, the pressure of the plasma generating chamber and the plasma treatment chamber being kept at 133 Pa, microwave being generated by the magnetron 1, and then measuring is performed. In this case, the diameter of the wave guide tube 7 is 234 mm, the longitudinal length A of the hole on the partition board 8 is 140 mm and the lateral length B is 200 mm, the distance between the partition board 8 and the microwave inlet window 9 is 55 mm, and the distance "1" between the wave guide tube 6 and the partition board 8 is varied. Ashing has been carried out under the above condition. As the result, shown in FIG. 3, when the distance "1" is 112 mm, a high ashing speed and an excellent ashing speed uniformity over the surface are attained. The range of preferable distance "1" is from 90 mm to 140 mm.

Figure 4:
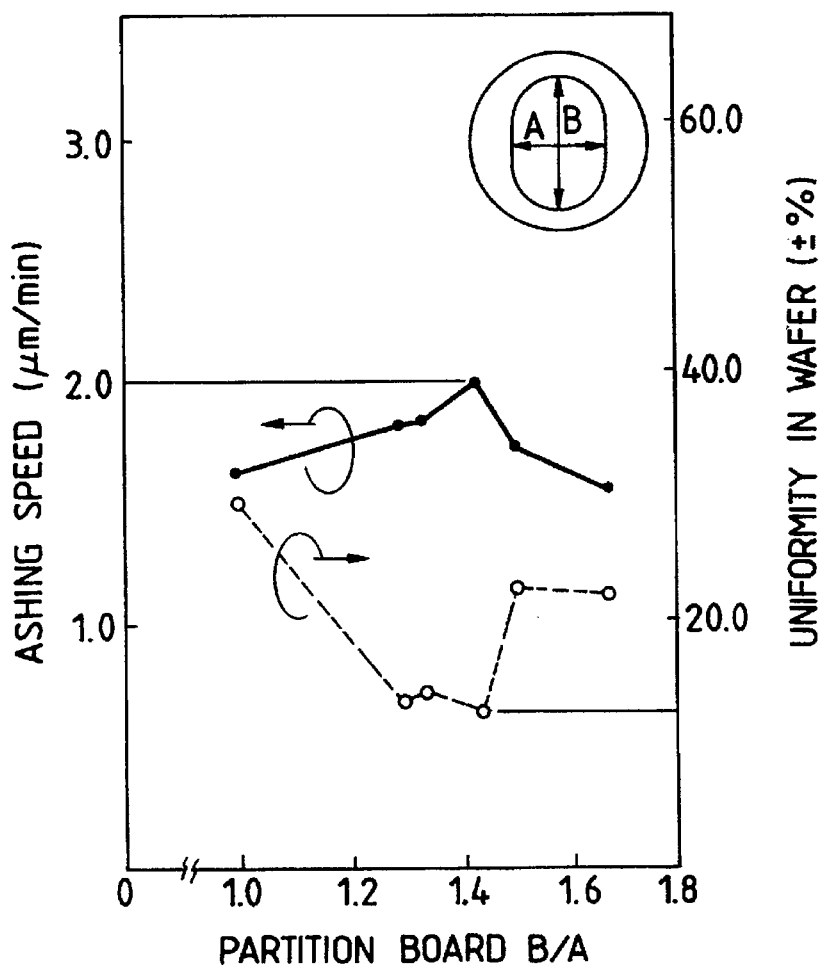
FIG. 4 is a graph showing a relationships between the shape of partition board and ashing speed and between the shape of partition board and ashing treatment speed uniformity over the surface for the microwave plasma apparatus shown in FIG. 1.

FIG. 4 shows the ashing speed and the ashing speed uniformity over a wafer when the aspect ratio (lateral B)/(longitudinal A) of the hole shape on the partition board 8 is varied. When the aspect ratio B/A is approximately 1.4, both the ashing speed and the uniformity over the wafer are at the maximum.

It can be thought that the combination of the resonance by means of setting the distance between the wave guide tube 6 and the partition board 8 to 112 mm and the resonance by means of the room formed with the partition board and the microwave inlet window 9 leads to producing a strong microwave electric field to increase the efficiency of plasma generation. Therewith, the ashing speed is improved and the ashing speed uniformity is also improved by producing a uniform electric field distribution. The optimum aspect ratio B/A depends also on the size of the microwave inlet window 9 as well as both on the distance "1" between the partition board and the wave guide tube and on the size of the room. The preferable range of the aspect ratio B/A is between 1.0 and 1.7.

Figure 5:
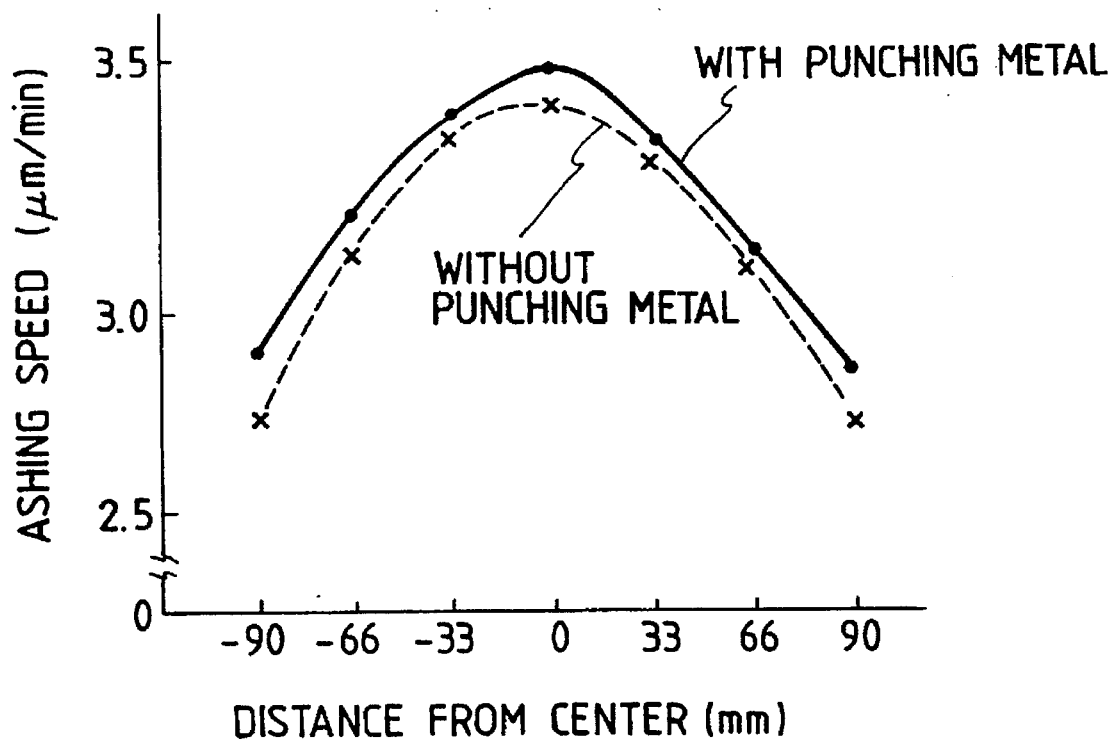
FIG. 5 is a characteristic graph comparing ashing speeds with/without punching metal for the microwave plasma treatment apparatus shown in FIG. 1.

A comparison has been made on the cases of "with punching metal 8" and "without punching metal" when the distance "1" is 112 mm. FIG. 5 shows this result.

According to the embodiment, by means of providing a ring-shaped partition board with a hole having an aspect ratio other than one in the expanded room of expanding wave guide tube, the electric field of the microwave inside the expanding wave guide tube can be made strong and uniform, and the high density and uniform plasma can be produced in the plasma discharge chamber. Therewith, improvement in ashing speed and improvement in ashing speed uniformity over the surface can be attained.

Although the above embodiments have been described on ashing for wafer, the apparatus according to the present invention can be also applied to etching to form a required shape or making deposit on a wafer utilizing plasma.

Figure 6:
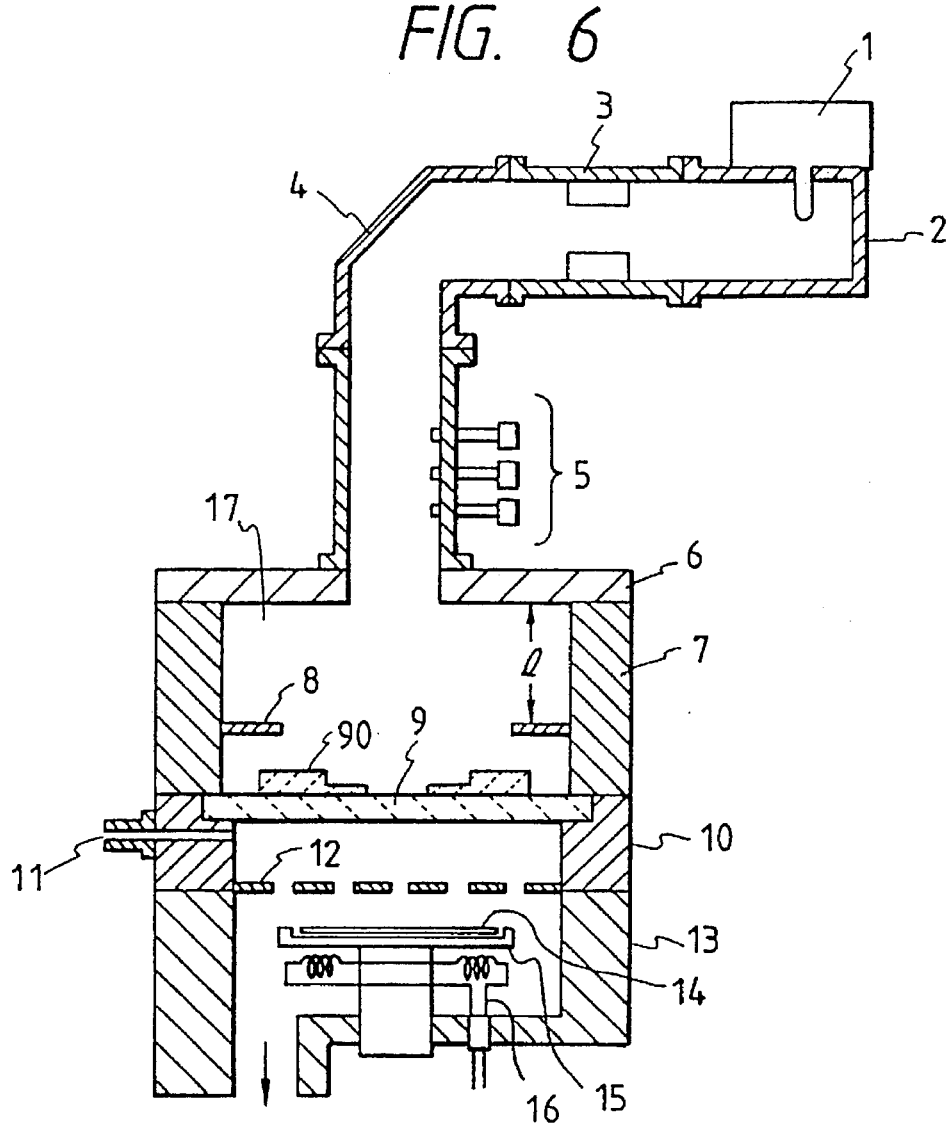
FIG. 6 is a vertical cross-sectional view showing the construction of another embodiment of a microwave plasma treatment apparatus according to the present invention.
Figure 7:
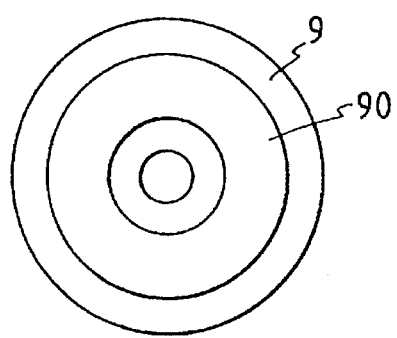
FIG. 7 is a plan view showing the construction of the vicinity of a microwave inlet window in the microwave plasma treatment apparatus shown in FIG. 6.

Another embodiment according to the present invention will be described below referring to FIG. 6 and FIG. 7.

In a case where plasma is strong in the central portion, the micro wave is strong in its center and weak in its periphery. In order to make such a electric field distribution uniform, a dielectric member, such as a silica plate 90, the thickness of which is thicker in its periphery, is placed on the upper side or bottom side of the window 9 as shown in FIG. 6 and FIG. 7 to make the electric field in periphery stronger with its lens effect.

Figure 8:
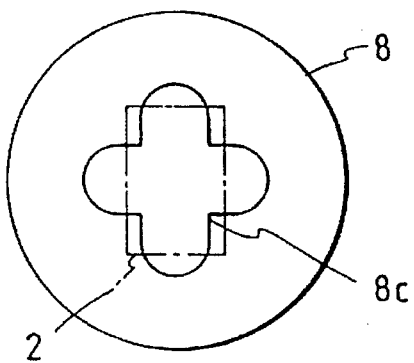
FIG. 8 is a plan view showing one example of the partition board in the microwave plasma treatment apparatus shown in FIG. 6.

On the other hand, by means of forming the hole on the partition board 8 in a cross-shape as shown in another embodiment in FIG. 8, the electric field in its center can be weakened and made uniform with concentrating the electric field to the four corner parts 8C. As the result, the plasma itself can be made uniform, and the ashing rate over the wafer, therefore, can be made uniform.

We claim:

1. A microwave plasma treatment apparatus which comprises:

a plasma generating chamber to which treatment gas is supplied and pressure of which is kept at a given pressure;

a plasma treatment chamber connected to said plasma generating chamber;

a wave guide tube one end of which is connected to said plasma generating chamber in the opposite side of the plasma treatment chamber and the other end of which is provided with a microwave generating source;

an expanded room having a certain space size at the portion of the plasma generating chamber connected with said wave guide tube; and a partition board inside said expanded room;

wherein said partition board is provided with a cross-shaped hole.

2. A microwave plasma treatment apparatus according to claim 1, further comprising:

a punching metal on the border between said plasma generating chamber and said plasma treatment chamber.

3. A microwave plasma treatment apparatus which comprises:

a plasma generating chamber to which treatment gas is supplied and pressure of which is kept at a given pressure;

a plasma treatment chamber connected to said plasma generating chamber;

a wave guide tube one end of which is connected to said plasma generating chamber in the opposite side of the plasma treatment chamber and the other end of which is provided with a microwave generating source;

an expanded room having a certain space size at the portion of the plasma generating chamber connected with said wave guide tube; and a partition board inside said expanded room;

wherein said partition board is provided with a ring-shaped hole having an aspect ratio other than one.

4. A microwave plasma treatment apparatus which comprises:

a plasma generating chamber to which treatment gas is supplied and pressure of which is kept at a given pressure;

a plasma treatment chamber connected to said plasma generating chamber;

a wave guide tube one end of which is connected to said plasma generating chamber in the opposite side of the plasma treatment chamber and the other end of which is provided with a microwave generating source;

an expanded room having a certain space size at the portion of the plasma generating chamber connected with said wave guide tube;

a partition board inside said expanded room; and a dielectric member, the thickness of which is thicker in its periphery, on an upper side or bottom side of a microwave inlet window to make an electric field in its periphery stronger with its lens effect.

5. A microwave plasma treatment apparatus, which comprises:

a plasma generating chamber;

means for supplying treatment gas into the plasma generating chamber;

a treatment chamber connected to one end of the plasma generating chamber through a punching metal;

means for evacuating the treatment chamber;

an expanded wave guide tube connected to the other end of the plasma generating chamber through a microwave inlet window and having an expanded room having a certain space size at the connecting portion of the plasma generating chamber; and a ring-shaped partition board with a hole having an aspect ratio other than one on the inside surface of expanded portion of the expanded wave guide tube.

6. A microwave plasma treatment apparatus according to claims 3 or 5, wherein said aspect ratio is between 1.0 and 1.7.

7. A microwave plasma treatment apparatus according to claim 5, wherein said punching metal has a plurality of small holes of which diameter is 3 to 15 mm.

8. A microwave plasma treatment apparatus according to claim 5, wherein the distance between said partition board and one end of said wave guide tube is from 90 mm to 140 mm.

9. A microwave plasma treatment apparatus according to any one of claims 1 to 6; wherein the plasma treatment chamber is utilized as an ashing treatment chamber.

10. A microwave plasma treatment apparatus according to claim 6, wherein said plasma treatment chamber enables receipt of a sample for treating a surface of said sample with the plasma.

* * * * *